United States Patent [19]

Baumann, Jr. et al.

[11] 4,378,605
[45] Mar. 29, 1983

[54] APPARATUS FOR DETECTION OF UNIFORMLY DISTRIBUTED NOISE INTERFERENCE AND METHOD THEREFOR

[75] Inventors: William J. Baumann, Jr., Scottsdale; John W. Buergel, Mesa, both of Ariz.

[73] Assignee: Motorola Inc., Schaumburg, Ill.

[21] Appl. No.: 278,513

[22] Filed: Jun. 29, 1981

[51] Int. Cl.³ .............................................. H04B 1/10
[52] U.S. Cl. .................................. 455/303; 324/57 N; 455/226
[58] Field of Search ............... 455/296, 226, 303, 304, 455/305, 306; 324/57 N, 77 E, 77 F; 328/165, 167

[56] References Cited

U.S. PATENT DOCUMENTS

| | | | |
|---|---|---|---|
| 3,587,097 | 6/1971 | Stull, Jr. | 324/77 E |
| 4,246,655 | 1/1981 | Parker | 455/303 |
| 4,387,222 | 6/1968 | Hellwarth et al. | 455/303 |

Primary Examiner—Jin F. Ng
Attorney, Agent, or Firm—Lewis S. Gruber; Eugene A. Parsons

[57] ABSTRACT

A detector which provides an indication of the presence of a uniformly distributed noise if and only if the DC-converted outputs of a plurality of filters independent of a desired signal all exceed a thermal noise threshold and the absolute value of the difference between the logarithms of the converted outputs of said plurality of filters does not exceed a channel amplitude ratio chosen as a maximum for fitting the definition of a uniform noise.

7 Claims, 2 Drawing Figures

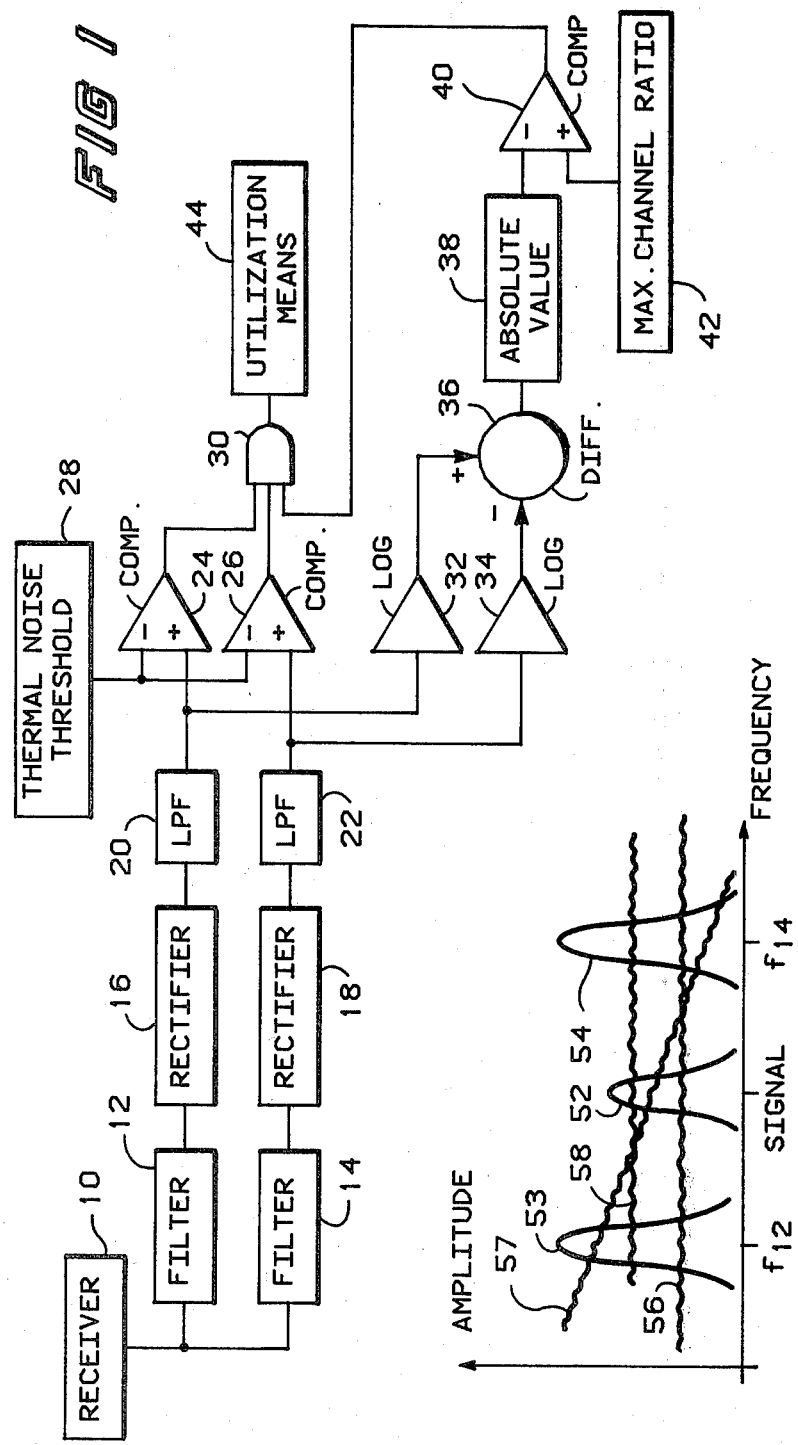

APPARATUS FOR DETECTION OF UNIFORMLY DISTRIBUTED NOISE INTERFERENCE AND METHOD THEREFOR

FIELD OF THE INVENTION

The present invention relates to noise interference detectors and more particularly to uniformly distributed noise interference detectors and methods for detecting uniformly distributed noise.

Apparatus for the reception of signals are commonly presented with the problem of distinguishing such signals from noise. The noise can be naturally occurring, such as component noise, or induced noise, such as modulated jamming.

Where a broadband signal is employed and narrowband interference is present, a gate can be generated to select or reject a signal whenever a pulse of energy is detected in a preselected narrow frequency range. For this purpose, systems can include a multi-channel filter for eliminating narrowband interference. In such a system, the broadband received signal is split such that equal power signals are applied to a plurality of channels. In each channel, the broadband signal is coupled through a narrowband filter and a detector and noise correlator to an output switch. The narrowband signals passing through the output switches are recombined in an adder having an output coupled to a utilization means. A disabling means in each channel disables that channel in response to the narrowband interference therein. The output from the adder thus reflects the broadband signal less the disabled narrowband interference. Because such systems depend upon the presence of a disproportionately high power output in channels containing noise in order to detect the presence of noise and to discriminate between the signal and the noise, they are not generally applicable where a narrowband signal is used and broadband noise is present.

Because of the lack of a simple and reliable method for detecting broadband noise in the presence of a narrowband signal, it has not generally been possible to selectively modify operation of a receiving apparatus based upon the presence or absence of broadband noise.

SUMMARY OF THE INVENTION

Accordingly it is an object of the present invention to provide a new and improved method for detection of noise interference which is uniformly distributed in frequency.

It is a further object to provide a new and improved detector which can discriminate between thermal noise and other types of noise that are uniformly distributed in frequency.

Still a further object of the present invention is to provide a new and improved detector which can discriminate between broadband noise that is uniformly distributed in frequency and broadband signals or interference that are not uniformly distributed in frequency.

Yet another object of the present invention is to provide a new and improved detector wherein narrowband noise can be distinguished from broadband noise.

These and other objects and advantages of the present invention will become apparent to those skilled in the art upon consideration of the accompanying specification, claims and drawings.

In order to attain the above mentioned and other objects and advantages, the present invention comprises input means for providing an input signal having a bandwidth and a plurality of bandpass filters coupled to said input means, each of said filters having a pass band comprising a different and small portion of the bandwidth of the input signal, said filters being chosen to have center frequencies and pass bands independent of a selected signal pass band and of each other. Means for rectifying and low pass filtering said portions of said input signal is coupled to said filters. Means for establishing a signal indicative of a desired maximum channel ratio is coupled to means for comparing said maximum channel ratio signal with a signal indicative of the ratio of signals passed by said rectification and low pass filtering means, said channel ratio comparing means providing an output only when said ratio of said signals passed by said rectification and low pass filtering means does not exceed said desired maximum channel ratio, said channel ratio comparing means being coupled to said rectification and low pass filtering means. Means for establishing a signal indicative of a selected noise threshold is coupled to means for comparing said noise threshold signal with said output signals of said rectification and low pass filtering means, said noise threshold comparing means providing an output only when all of said outputs of said rectification and low pass filtering means exceed said noise threshold, said noise threshold comparing means being coupled to said rectification and low pass filtering means. An AND-gate is coupled to and is responsive to output signals from said channel ratio comparing means and is coupled to and is responsive to signals from said noise threshold comparing means. Said AND-gate is coupled to means for providing an output.

Among the advantages of the present invention over the prior art are: the ability to detect broadband noise, which is uniformly distributed in frequency in the presence of a narrowband signal or in the presence of a broadband, non-uniformly distributed signal; the ability to detect an imbalance in the background noise level in a receiver; the ability to act as a squelch in a radio; and the ability to provide an indication of the presence of broadband noise jamming to allow guidance or receiver systems to switch to appropriate alternate operating modes.

BRIEF DESCRIPTION OF THE DRAWINGS

FIG. 1 is a block diagram of a device embodying the present invention; and

FIG. 2 is a graph depicting the frequency relationships among system filters and signals received by the present invention.

DESCRIPTION OF THE PREFERRED EMBODIMENT

In a preferred embodiment of the uniformly distributed noise level detector as illustrated in FIG. 1, receiver 10 is connected to filter 12 and filter 14. Filter 12 is connected to rectifier 16 which is in turn connected to low pass filter 20. Low pass filter 20 is connected to a non-inverting input of comparator 24 and to the input of logarithmic amplifier 32. Filter 14 is connected to rectifier 18 which is in turn connected to low pass filter 22. Low pass filter 22 is connected to a non-inverting input of comparator 26 and to the input of logarithmic amplifier 34. Thermal noise threshold signal source 28 provides a second input to the inverting input of comparator 24 and a second input to the inverting input of comparator 26. The outputs of logarithmic amplifier 32 and logarithmic amplifier 34 are both connected to differencing device 36 whose output is in turn connected to absolute value circuit 38. An output of absolute value circuit 38 provides an inverting input to comparator 40, while the non-inverting input to comparator 40 is provided by maximum channel ratio source 42. Comparator 24, comparator 26, and comparator 40 each provide an input to AND gate 30. The output of AND-gate 30 is supplied to utilization means 44.

The preferred embodiment can be implemented using a variety of readily available parts. By way of examples, a part numbered TL441, sold by Texas Instruments of Dallas, Texas, could be used for the logarithmic amplifiers. The rectifier can be a half wave rectifier comprising diodes, part number 1N4942, and a feedback loop around an operational amplifier. The absolute value circuit can be implemented as a full wave rectifier comprising several operational amplifiers with diode feedback, the diodes used being part number 1N3600.

In the operation of the present invention, as illustrated in FIG. 1, receiver 10 supplies an output in the form of alternating current to filter 12 and filter 14. Input received by receiver 10 could be in any one of a variety of forms including audio frequency input or radio frequency input. The output of receiver 10 as supplied to filters 12 and 14 can be divided into three categories: a signal, narrowband noise including clutter, and broadband noise, including both thermal noise and broadband jamming. In the plot of amplitude versus frequency in FIG. 2, curve 52, representing the narrow signal band, curve 53, representing the bandwidth of filter 12 having a filter center frequency $f_{12}$, and curve 54, representing the pass band of filter 14 having a filter center frequency of $f_{14}$, are shown against the background of thermal noise curve 56, curve 57, representing a broadband, non-uniformly distributed noise, and curve 58, representing broadband uniformly distributed noise interference. As can be seen in FIG. 2, filter 12 and filter 14 are chosen so that their filter center frequencies, $f_{12}$ and $f_{14}$ respectively, are far enough apart to make them independent of each other and of signal band 52. When selected in this manner, the output of filter 12 and the output of filter 14 serve as samples of the frequency spectrum within the pass band of the receiver but outside of the expected narrow signal spectrum 52.

The alternating current output of filter 12 is converted into a direct current form by the combined action of rectifier 16 and low pass filter 20, which, taken together, form a converting means. Likewise, the output of filter 14 is converted into direct current form by the combined action of rectifier 18 and low pass filter 22.

The outputs of low pass filter 20 and low pass filter 22 are next compared in two ways to detect the presence of uniform noise. In the first comparison in comparator 40, the absolute value of the difference of the logarithms of the outputs is compared to a predetermined value for the maximum amount of difference to be allowed between the channels for the detected noise to be characterized as uniform. As is understood by those skilled in the art, for two signals A and B, the use of a signal ratio, for example log A/B=log A−log B, rather than an absolute signal difference, for example A-B, provides the present invention with the important ability to operate over a wide dynamic range. The use of an absolute signal difference is encompassed within the scope of the present invention where dynamic range is narrow and such a difference could be obtained by means known to those skilled in the art. A "means for comparing a maximum channel difference" could thus comprise either a signal ratio or an absolute difference device.

In the second comparison, the output of each low pass filter is compared to a threshold value established for the thermal noise by comparators 24 and 26. Only if both the ratio between the noise level in the channels is small enough for the noise to be characterized as uniform and if the noise level in both channels exceeds the thermal noise threshold is an indication given that broadband noise is present.

In the embodiment of the present invention as illustrated in FIG. 1, a thermal noise threshold level is established by means 28. The threshold level could be set, for example, by using a voltage source and a variable resistance, or it could be variably dependent upon an output of some sort of sensing apparatus, such as a thermistor. Factors important to the setting of the level can include the desired probability of false alarm and the desired probability of detection of uniform noise. The output of means 28, representing the thermal noise threshold, is applied to comparator 24 which provides a high level output to AND-gate 30 only if the output of low pass filter 20 exceeds the established thermal noise threshold. The output of means 28 is also applied to comparator 26 which provides a high level output to AND-gate 30 only if the output of low pass filter 22, as applied to comparator 26, exceeds the established thermal noise threshold.

In order to determine the ratio of the levels of noise in the two channels, the output of low pass filter 20 is logarithmically amplified in logarithmic amplifier 32 and the output of low pass filter 22 is logarithmically amplified in logarithmic amplifier 34. Then the output of logarithmic amplifier 32 and logarithmic amplifier 34 are applied to differencing circuit 36. Next, the difference between the outputs of the logarithmic amplifiers, as determined by differencing circuit 36, is applied to absolute value circuit 38. The output of absolute value circuit 38 serves as one input of comparator 40. Channel circuit 38 serves as one input of comparator 40. Channel ratio means 42 provides an output reference indicative of a maximum desired ratio which is applied as a second input to comparator 40. One skilled in the art understands that use of a signal indicative of a signal ratio is appropriate for the preferred embodiment but that where an absolute signal difference is generated, a signal indicative of a desired maximum channel difference could be used. The maximum channel ratio means 42 can comprise, for example, a voltage source and a variable resistance. The output of comparator 40 is high only when the absolute value of the difference of the logarithms of the outputs of the two channels is less than the established maximum channel ratio established by means 42.

Thus AND-gate 30 provides an indication of a uniformly distributed noise only if the outputs of comparators 24 and 26 are high, indicating that the thermal noise threshold is exceeded by the undesired or induced noise signal, and only if the output of comparator 40 is high as well, indicating that the ratio of the level of noise detected in the band pass by filter 12 and the level of noise in the band pass by filter 14 is less than the maximum channel ratio which could be allowed for a noise to be considered uniform within the sensed spectrum. AND-gate 30 provides such an indication of uniform noise to utilization means 44.

The action taken by utilization means 44 in response to the indication by AND-gate 30 of the presence of the uniform noise can take any of many forms. For example, means 44 could be used to suppress the audio frequency output of a radio receiver in the manner of a squelch circuit. In a different application, utilization means 44 could be a circuit for switching a radar receiver to alternate modes of tracking in the presence of a broadband noise jamming signal. When some type of noise is known to be present, the lack of an output from the present invention provides the information that there exists a noise imbalance or that the noise is otherwise not uniform, as would be the case with the noise represented by curve 57 in FIG. 2.

As understood by one skilled in the art, the present invention is suited to cooperate with well known components in a radio to provide a squelch function and to form thereby a new and improved reception apparatus. Similarly, one skilled in the art comprehends from the above specification that the present invention can act cooperatively with components of a guidance apparatus to allow such apparatus to switch to alternative operating modes when broadband noise jamming is detected. Through such cooperation, a new and improved guidance apparatus would result.

While the present invention has been described in terms of a preferred embodiment, further modifications and improvements will occur to those skilled in the art. For example, one skilled in the art recognizes upon examination of the present invention that more than two channels could be used in order to increase the ability to discriminate among types of noise covering different portions of the pass band of the receiver. Likewise, one skilled in the art will understand from the above description that various logic circuits could be utilized within the scope of the present invention to indicate the presence of noise imbalances in the receiver including combinations of noises.

I desire it to be understood, therefore, that this invention is not limited to the particular form shown and I intend in the appended claims to cover all such equivalent variations which come within the scope of the invention as described.

What is claimed is:

1. Apparatus for detecting uniformly distributed noise in an input signal having a bandwidth, said apparatus comprising in combination: means for accepting the input signal; a plurality of band pass filters each of said band pass filters being coupled to said means for accepting the input signal, each of said band pass filters having a pass band comprising a different portion of the bandwidth of the input signal and each of said band pass filters being chosen to have a pass band independent of a selected signal pass band; means coupled to said plurality of bandpass filters for converting bandwidth portions of said input signal passed by said band pass filters from alternating current to direct current form; means for establishing a signal indicative of a desired maximum channel amplitude difference; means coupled to said means for converting said bandwidth portions for providing a difference signal indicative of the difference in amplitude between signals passed by said means for converting said bandwidth portions; first comparing means for comparing said maximum channel amplitude difference signal with said difference signal and for providing an output signal only when the difference signal does not exceed said desired maximum channel amplitude difference; means for establishing a reference signal indicative of a preselected noise threshold; second comparing means for comparing said noise threshold reference signal with each signal from said means for converting and for providing an output signal only when the level of each output signal from said means for converting exceeds said noise threshold; a logic gate responsive to output signals from said first and said second comparing means; and means for providing a detector output coupled to said logic gate.

2. The apparatus as recited in claim 1, wherein said means for providing a difference signal comprises in combination: a plurality of logarithmic amplifiers, each of said plurality of logarithmic amplifiers being coupled to said means for converting; means for comparing the outputs of said logarithmic amplifiers to provide a difference output; means coupled to said comparing means to provide an absolute value of said difference output; said first comparing means comprising a differential amplifier, coupled to said means for establishing a signal indicative of a desired maximum channel amplitude difference and said means for providing the absolute value of said difference signal, the output of said differential amplifier being coupled to said logic gate.

3. The apparatus as recited in claim 1 wherein said means for converting comprises in combination: a plurality of rectifiers, each of said rectifiers being coupled to a respective one of said plurality of band pass filters; and a plurality of low pass filters, each of said low pass filters being coupled to a respective one of said rectifiers, the output of said low pass filters coupled to said second comparing means.

4. The apparatus as recited in claim 1 wherein said second comparing means comprises a plurality of differential amplifiers, each of said differential amplifiers being coupled to said means for converting.

5. A reception apparatus, for use with a signal having a bandwidth, comprising in combination: means for receiving a signal; a plurality of band pass filters each of said band pass filters being coupled to said means for receiving a signal, each of said band pass filters having a pass band comprising a different portion of said bandwidth of the input signal and each of said plurality of band pass filters being chosen to have a pass band independent of a selected signal pass band; means coupled to said plurality of band pass filters for converting bandwidth portions of said input signal passed by said band pass filters from alternating current to direct current form; means for establishing a signal indicative of a desired maximum channel amplitude difference; means coupled to said means for converting said bandwidth portions for providing a difference signal indicative of the difference in amplitude between signals passed by said means for converting; first comparing means for comparing said maximum channel amplitude difference signal with said difference signal and for providing an output signal only when the difference signal does not exceed said desired maximum channel amplitude difference; means for establishing a reference signal indicative of a preselected noise threshold; second comparing means for comparing said noise threshold reference signal with each signal from said means for converting and for providing an output signal only when the level of each output signal from said means for converting exceeds said noise threshold, a logic gate responsive to output signals from said first and said second comparing means; and means coupled to said logic gate for using said output of said logic gate to modify operation of said reception apparatus.

6. A guidance apparatus for use with a signal having a bandwidth comprising in combination: means for receiving a signal; a plurality of band pass filters coupled to said means for receiving a signal, each of said band pass filters having a pass band comprising a different portion of the bandwidth of the input signal and each of said band pass filters being chosen to have pass bands independent of a selected signal pass band; means coupled to said plurality of bandpass filters for converting bandwidth portions of said input signal passed by said band pass filters from alternating current to direct current form; means for establishing a signal indicative of a desired maximum channel difference; means coupled to said means for converting said bandwidth portions for providing a signal indicative of the difference in amplitude between signals passed by said means for converting; first comparing means for comparing said maximum channel amplitude difference signal with said difference signal and for providing an output signal only when the difference signal does not exceed said desired maximum channel difference; means for establishing a signal indicative of a preselected noise threshold; second comparing means for comparing said noise threshold signal with signals from said means for converting and for providing an output signal only when the level of each output signal from said means for converting exceeds said noise threshold; a logic gate responsive to said first and second comparing means; and means coupled to said logic gate for using a detector output signal to modify operation of the guidance apparatus.

7. A method for detecting a uniformly distributed noise in an input signal having a bandwidth, said method comprising the steps of: passing said input signal through a plurality of bandpass filters, converting bandwidth portions of said input signal passed by said bandpass filters from alternating current to direct current form, establishing a signal indicative of a desired maximum channel amplitude difference, providing a difference signal indicative of the difference in amplitude between signals derived from said converting step by (1) determining logarithms of the signals derived from said converting step, (2) providing a difference output from said logarithms, (3) determining an absolute value of said difference output to provide said difference signal, first step of comparing said signal indicative of a desired maximum channel amplitude difference with said difference signal, establishing a noise threshold reference signal, second step of comparing said noise reference signal with bandwidth portions of the input signal derived from said converting step, said first and second comparing steps providing an indication of the presence of a uniformly distributed noise if and only if each of said bandwidth portions of said input signal derived from said converting step exceeds said noise threshold and the absolute value of said difference signal does not exceed said desired maximum channel amplitude difference.

* * * * *